(12) United States Patent
Tasaki et al.

(10) Patent No.: US 8,273,605 B2
(45) Date of Patent: Sep. 25, 2012

(54) MANUFACTURING METHOD FOR ELECTRONIC DEVICE HAVING IC CHIP AND ANTENNA ELECTRICALLY CONNECTED BY BRIDGING PLATE

(75) Inventors: Kouji Tasaki, Chikusei (JP); Hironori Ishizaka, Chikusei (JP); Masahito Shibutani, Chikusei (JP); Kousuke Tanaka, Chikusei (JP); Masahisa Shinzawa, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1551 days.

(21) Appl. No.: 10/581,721

(22) PCT Filed: Dec. 2, 2004

(86) PCT No.: PCT/JP2004/017939
§ 371 (c)(1),
(2), (4) Date: Apr. 27, 2007

(87) PCT Pub. No.: WO2005/055130
PCT Pub. Date: Jun. 16, 2005

(65) Prior Publication Data
US 2011/0133345 A1    Jun. 9, 2011

(30) Foreign Application Priority Data
Dec. 5, 2003   (JP) .................................. 2003-407182

(51) Int. Cl.
*H01L 23/48* (2006.01)
*H01L 21/44* (2006.01)
(52) U.S. Cl. .................... 438/118; 257/783; 438/108
(58) Field of Classification Search .................. 438/108, 438/118; 257/783
See application file for complete search history.

(56) References Cited

U.S. PATENT DOCUMENTS
5,027,107 A    6/1991   Matsuno et al.
(Continued)

FOREIGN PATENT DOCUMENTS
EP    1 538 560    6/2005
(Continued)

OTHER PUBLICATIONS
Japanese Official Action issued on Feb. 3, 2009, for Application No. 2005-515960.
(Continued)

*Primary Examiner* — Howard Weiss
*Assistant Examiner* — Tifney Skyles
(74) *Attorney, Agent, or Firm* — Antonelli, Terry, Stout & Kraus, LLP.

(57) ABSTRACT

There is provided an electronic device manufacturing method capable of manufacturing a device having a preferable communication characteristic at a low cost with a high productivity. The manufacturing method is for manufacturing an electronic device including a plurality of IC chips 100, each having external electrodes formed on a pair of opposing surfaces. One 102 of the electrodes is arranged on an antenna circuit 201 in a transmission/reception antenna having a slit. Furthermore, a bridging plate 300 is arranged for separately and electrically connecting the other external electrode 103 to a predetermined position of the corresponding antenna circuit 301. The method is characterized in that by positioning at least one of the IC chips 100 with the predetermined position on the corresponding antenna circuit 201 to be mounted, it is possible to arrange the retraining IC chips 100 at the predetermined positions on the antenna circuit 201 all at once.

21 Claims, 5 Drawing Sheets

U.S. PATENT DOCUMENTS

| | | |
|---|---|---|
| 2001/0012645 A1 | 8/2001 | Usami |
| 2003/0173408 A1* | 9/2003 | Mosher et al. ............... 235/492 |
| 2004/0061613 A1* | 4/2004 | Usami ...................... 340/572.8 |
| 2005/0134460 A1* | 6/2005 | Usami ...................... 340/572.7 |

FOREIGN PATENT DOCUMENTS

| | | |
|---|---|---|
| JP | 2001-217380 | 8/2001 |
| JP | 2002-190003 | 7/2002 |
| JP | 2002-269520 | 9/2002 |
| JP | 2002-366917 | 12/2002 |
| JP | 2004-127230 | 4/2004 |
| JP | 2004-363415 | 12/2004 |

OTHER PUBLICATIONS

Korean Official Action for Application No. 10-2006-7013553, dated Aug. 18, 2008.

Japanese Official Action for Application No. 2005-515960, dated Oct. 24, 2008.

Korean Official Action for Application No. 10-2006-7013553, dated Sep. 19, 2007.

EP Examination Report (Official Action) dated Dec. 14, 2010, for EP Application No. 04 819 892.3-2210.

Japanese Official Action for Application No. 2005-515960, dated Oct. 21, 2008.

Chinese Official Action issued Apr. 3, 2009, for Application No. 2004800358459.

Supplementary European Search Report dated Apr. 16, 2009, for Application No. EP 04 81 9892.

EP Official Action dated Dec. 1, 2011, for EP Application No. 04 819 892.3-2210.

K. Susumu, et al., "VLSI Packaging Technology", First and Second Volumes, Nikkei BP, 1993, pp. 1-5, 9-13, 78, 79 and 104-108.

M. Usami et al., "Powder LSI: An Ultra Small RF Identification Chip for Individual Recognition Applications", 2003 IEEE International Solid-State Circuits Conference, Session 22, TD: Embedded Technologies, Paper 22.7, pp. 398, 399 and 501.

* cited by examiner

FIG. 1 CONVENTIONAL

MANUFACTURING METHOD FOR ELECTRONIC DEVICE HAVING IC CHIP AND ANTENNA ELECTRICALLY CONNECTED BY BRIDGING PLATE

TECHNICAL FIELD

The present invention relates to a noncontact type individual identification device providing an IC chip, a manufacturing method for manufacturing a device that furnishes excellent communication properties and that can be produced economically, as well as a member used in that electronic device.

BACKGROUND ART

In recent years noncontact type individual identification systems that employee RFID (Radio Frequency Identification) tags have been focused on for use in systems for managing the entire lifecycle of a product, including all commercial aspects of manufacturing a product, its distribution and sales. Radio wave type RFID tags that use 2.45 GHz microwaves are noted for the structure that includes an external antenna attached to an IC chip which enables communication to be performed over several meters. Presently, construction is ongoing of systems that operate for distribution of mass-manufactured products as well as their product management and product history management.

Current examples of radio wave type RFID tag systems using microwaves include products developed by Hitachi or Renesas that use a TCP (Tape Carrier Package) inlet. The manufacture of the TCP type inlet employs the TAB (Tape Automated Bonding) method in which IC chips having all external electrodes formed on the same surface thereof are mounted, each individually, on a tape carrier formed of a polyimide substrate with a succession of copper antenna circuits (Kouyama Susumu and Naruse Kunihiko "VLSI Packaging Technology", first and second volumes, Nikkei BP, 1993). RFID tag manufacturing processes employing a typical TAB method will now be described with reference to FIG. 1.

Figure 1:
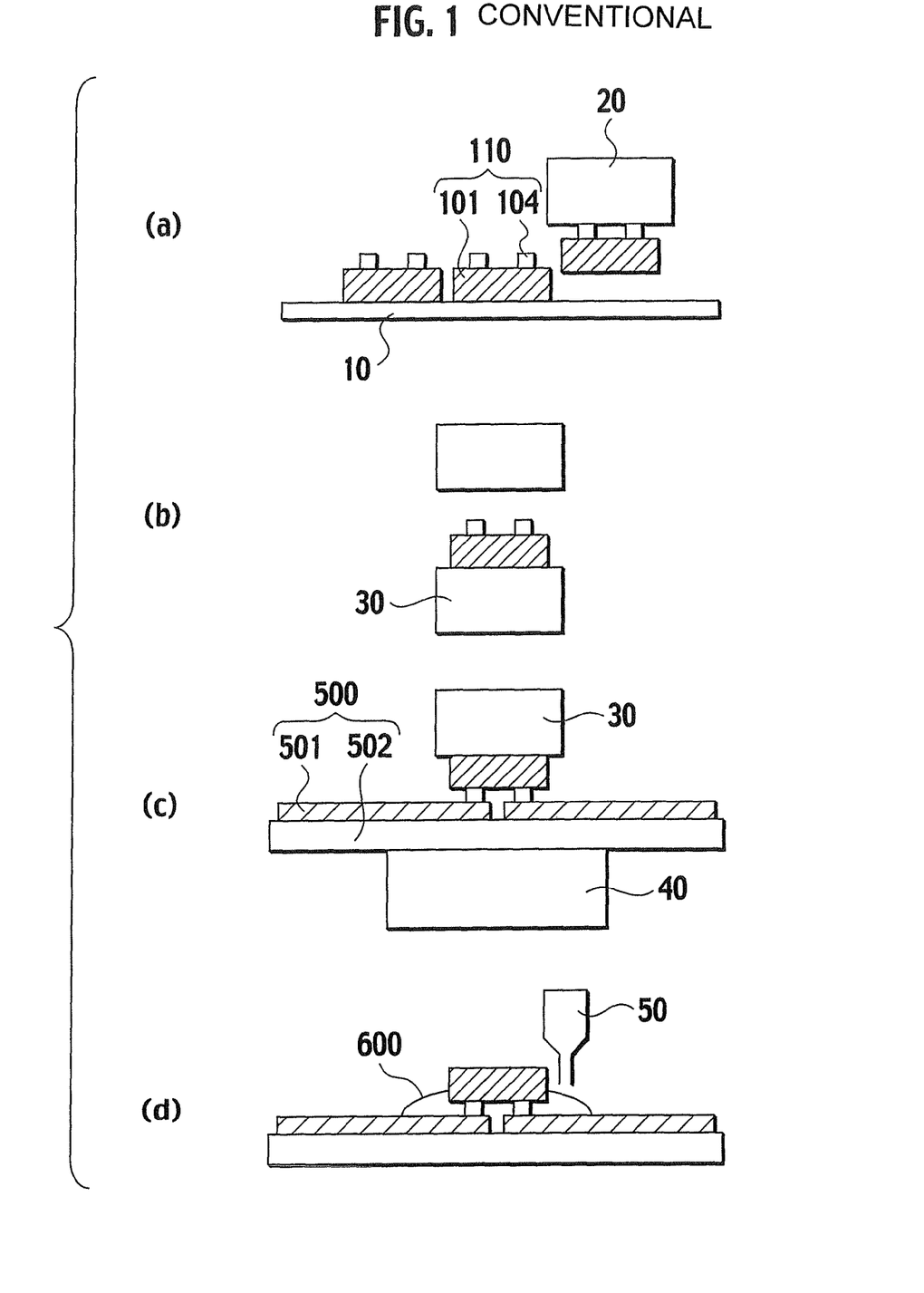
FIG. 1 depicts the conventional manufacturing method.

As shown in FIG. 1 (a) of FIG. 1, after an IC chip 110 having a gold bump 104 formed on the circuit surface and in which all external electrodes are formed on the same face is separated into individual pieces by a dicing process, the individual piece is sucked from a dicing film 10 using a vacuum suction unit 20. Next, as shown in FIG. 1 (b), the piece is moved to a vacuum suction station 30 so that the gold bumps 104 of the IC chip 110 having all external electrodes formed on the same face thereof are on upper face. Next, as shown in FIG. 1 (c) the vacuum suction station 30 is inverted such that the gold bumps 104 become the lower face. Next, the IC chip 110 having all of the external electrodes thereof formed on the same face is positioned in the determined position with respect to an antenna substrate 500, being a polyimide substrate with copper film attached produced such that the copper film of that substrate is formed as an antenna circuit, and thereafter the IC chip 110 is secured in place by a thermal compression binding process using a heater 40. Connections can then be formed at the connecting parts of the gold bumps on the antenna circuit 501 by a tin-gold alloy formed by applying a tin or solder plating thereto. As shown in FIG. 1 (d), the gaps occurring between the IC chip 110 having all external electrodes formed on the same face thereof and the substrate 500 are sealed using a thermoset resin 600. The condition of this thermoset resin once the thermosetting process is complete is the intermediate condition of the RFID tag called an inlet. Accommodating this inlet in a label or thin case enables it to be used as an RFID tag.

Other inlet structures include for example having an IC chip in which the external electrodes of the IC chip are formed individually on the respective surfaces of a pair of opposing surfaces, as developed by Usami of Hitachi, having a glass diode package structure in which a dipole antenna connects to each external electrode formed on the respective surfaces (Japanese Unexamined Patent Application Publication No. 2002-269520). Further, in the device disclosed by Usami et al. when the IC chip in which the above described two external electrodes are formed individually on each of the surfaces of a pair of opposing surfaces of the IC chip is furnished with an excitation slit type dipole antenna, the external electrodes formed individually on each of the surfaces of a pair of opposing surfaces of an IC chip are disposed between the legs of an antenna to produce a sandwich antenna construction (ISSCC Digest of Technical Papers pages 398-399, 2003). In this dipole antenna structure having an excitation slit, the impedance of the antenna and input impedance of the IC chip can be made compatible by changing the width and length of the slit, thereby increasing the distance of achievable transmission.

DISCLOSURE OF THE INVENTION

In order to realize distribution and management of manufacture of a large number of products by a noncontact type individual identification system using RFID tags it is necessary to attach an RFID tag to each product, and this makes mass manufacture of RFID tags cheaply indispensable.

However, in order to form a resonant circuit in which the two external electrodes of an IC chip are connected to an antenna by spanning an excitation slit in an excitation type dipole antenna construction that provides favorable communication properties, it is necessary, in the case of an IC chip in which all the external electrodes are formed on the same face, to achieve precise positioning of the two external electrodes for signal input and the slit. Therefore, in the conventional art, the TAB method shown in FIG. 1 is used and each IC chip is mounted on the antenna substrate individually. This TAB method however has significant problems. This is because in the method the steps of suction from the dicing film applied to an IC chip having all external electrodes formed on the same face thereof using a vacuum suction device, of the positioning and thermal compression binding of the IC chip having all external electrodes formed on the same face thereof to an antenna substrate and moreover of sealing with resin must be performed in respect of each individual IC chip, and it is extremely troublesome to make the available operating time for each process occur in one second or to reduce this below one second. This is a substantial problem affecting mass manufacture in this method.

Further, if the available operating time is long then labor expenses increase concomitantly, mitigating against lower-cost manufacture, also as the connection between an IC chip having all external electrodes formed on the same face thereof and an antenna substrate is realized using a gold-tin or gold solder connection, it is necessary to use as the substrate material a taped substrate having copper film attached to polyimide film that is expensive but strongly resistant to heat. This makes it very difficult to produce the inlet economically.

If the above described sandwich antenna construction is used, which encloses by an antenna each of the external electrodes formed individually on each of the faces of an IC chip formed having two external electrodes each disposed individually on the respective faces that are an opposing pair, the positioning between an excitation slit and each of the external electrodes formed individually on each of the faces of the IC chip must be extremely precise, and in the case of manufacturing methods of the conventional art that employ the TAB method, if the size of an IC chip having two external electrodes formed individually on the respective faces of an opposing pair is made less than 0.4 mm, then the suction process applied to the IC chip using a vacuum suction device in the conventional art is difficult and it becomes difficult to realize mass manufacture at low cost of the inlet.

In light of the above, the present invention provides manufacturing method for producing an electronic device that furnishes excellent communication properties and that can be produced economically, as well as a member used in the electronic device.

That is to say, the present invention is as follows.

(1) A manufacturing method for an electronic device providing an IC chip having an external electrode formed respectively on each of the faces of an opposing pair, a transmission and reception antenna having a slit formed therein and a bridging plate that electrically connects the IC chip and the antenna, in which if at least one of a plurality of IC chips that are arranged is positionally aligned corresponding to the determined position on the antenna circuit to be mounted, then the remaining IC chips can be disposed at once and together in the prescribed positions on the antenna circuit without the necessity of performing high precision positioning.

(2) A manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the plurality of IC chips at once, to bridging plates having a second metallic film formed thereon via a first anisotropic conductive adhesive layer such that the plurality of the IC chips thus arranged are electrically connected, and producing bridging plates with the IC chips attached; a step of positionally aligning the bridging plates with IC chips attached in the determined position on the plurality of antenna circuits such that the plurality of the IC chips are electrically connected; and a step of thermal compression binding that joins the bridging plates with IC chips attached at once in the determined positions on the antenna substrate via a second anisotropic conductive adhesive layer.

(3) A manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the IC chips, via the first anisotropic conductive adhesive layer, after the plurality of the arranged IC chips have been positionally aligned at once, such that the plurality of the IC chips will be electrically connected in the determined positions with respect to the corresponding circuits of the plurality of antenna circuits on which they will be mounted; a step of positionally aligning the tentatively secured plurality of IC chips with bridging plates having a second metallic film so as to be electrically connected in the determined position on an antenna circuit; and a step of thermal compression binding the bridging plates at once on the plurality of the IC chips and the antenna substrate, via a second anisotropic conductive adhesive layer.

(4) A manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of forming a first anisotropic conductive adhesive layer in the determined position on the antenna circuit; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the IC chips, after the plurality of the IC chips arranged on the first anisotropic conductive adhesive layer have been positionally aligned at once, such that the plurality of the IC chips will be electrically connected in the determined positions with respect to the corresponding circuits of the plurality of antenna circuits on which they will be mounted; a step of forming a second anisotropic conductive adhesive layer in the determined position on the plurality of IC chips thus secured and the antenna circuits; a step of positionally aligning the tentatively secured plurality of IC chips with bridging plates having a second metallic film so as to be electrically connected in the determined position on the IC chips and the antenna circuits; and a step of thermal compression binding the bridging plates at once on the plurality of the IC chips and the antenna substrate.

(5) A manufacturing method for an electronic device providing an IC chip having an external electrode formed respectively on each of the faces of an opposing pair, a transmission and reception antenna having a slit formed therein and a bridging plate that electrically connects the IC chip and the antenna, having at least the steps of dividing a bridging plate such that one piece is equivalent to the number of the IC chips in a line arranged in the widthwise direction of an antenna substrate, that can be subject to thermal compression binding at once, line by line; positionally aligning the divided bridging plates with one row of antenna circuits arranged in the widthwise direction of an antenna substrate; and performing thermal compression binding that joins the bridging plates on the IC chips and the antenna substrate via an anisotropic conductive adhesive layer.

(6) The first to fifth manufacturing methods above, wherein at least one of the first or the second metallic film is aluminum.

(7) The first to fifth manufacturing methods above, wherein at least one of the first or the second metallic film is supported on a base substrate of an organic resin, this organic resin being selected from among polyvinyl chloride (PVC), acrylonitrile butadiene styrene (ABS), polyethylene terephthalate (PET), polyethylene terephthalate glycol (PETG), polyethylene naphthalate (PEN), polycarbonate resin (PC), biaxial polyester (O-PET), or polyimide resin.

(8) The first to fifth manufacturing methods above, wherein at least one of the first or the second metallic film is supported on a base substrate comprised of paper.

(9) The first to fifth manufacturing methods above, wherein the gaps between the antenna substrate and bridging plate are sealed by thermal compression binding of the first and second anisotropic conductive adhesive layers.

(10) The first to fifth manufacturing methods above wherein after the process in which the plurality of IC chips are thermal compression bound at once with the antenna substrate and the bridging plates, a process is performed in which a continuum of antenna circuits is cut into individual pieces.

(11) A member of an electronic device which electronic device provides an IC chip having an external electrode formed respectively on each of the faces of an opposing pair, a transmission and reception antenna having a slit formed therein and a bridging plate that electrically connects the IC chip and the antenna, wherein this member is semiconductor elements of the condition in which an anisotropic conductive adhesive layer having been formed on the respective surfaces of the IC chip to which the external electrodes attach, the IC chip is enclosed between these anisotropic conductive adhesive layers.

(12) A member of an electronic device which electronic device provides an IC chip having an external electrode formed respectively on each of the faces of an opposing pair, a transmission and reception antenna having a slit formed therein and a bridging plate that electrically connects the IC chip and the antenna, wherein this member is semiconductor elements of the condition in which an anisotropic conductive adhesive layer having been formed on the respective surfaces of the IC chip to which the external electrodes attach, the IC chip is enclosed between these anisotropic conductive adhesive layers while another bridging plate has been disposed on the face of one of those anisotropic conductive adhesive layers.

(13) The first to fifth manufacturing methods above wherein the method of arranging in at least one of a longitudinal orientation or a horizontal orientation, a plurality of the IC chips with the same intervals therebetween as are required when the plurality of the IC chips are arranged in determined positions with respect to the corresponding circuits of the plurality of antenna circuits on which the plurality of the IC chips will be mounted and arranging the plurality of IC chips at once, is a method that involves using a jig providing from a few to several thousands of concavities of the appropriate dimensions to accommodate an IC chip, then shaking the jig such that the IC chips on the jig are accommodated in each of the concavities.

(14) The first to fifth manufacturing methods above wherein thermal compression binding is performed that joins the bridging plates and the IC chips with the antenna substrate.

The manufacturing method for an electronic device and the member used for the electronic device furnish the following effects. As a plurality of the IC chips having an external electrode formed respectively on each of the faces of an opposing pair are arranged and mounted at once on and antenna substrate and a plurality of bridging plates, superior productivity can be realized, further excellent communication properties are obtained. Further, as the available operating time in the manufacture of each inlet is reduced to one second or below one second and the IC chips, antenna substrate and bridging plates are connected via an anisotropic conductive adhesive layer, cheaper materials can be used for the base substrate and antenna circuit thereby enabling a more economical inlet to be realized.

BEST MODE FOR CARRYING OUT THE INVENTION

The embodiments of the invention will now be described with reference to the drawings.

The electronic device of the present invention provides an IC chip having an external electrode formed respectively on each of the faces of an opposing pair of faces thereof, a transmission and reception antenna having a slit formed therein, and a bridging plate that electrically connects the IC chip and the antenna.

Figure 2:
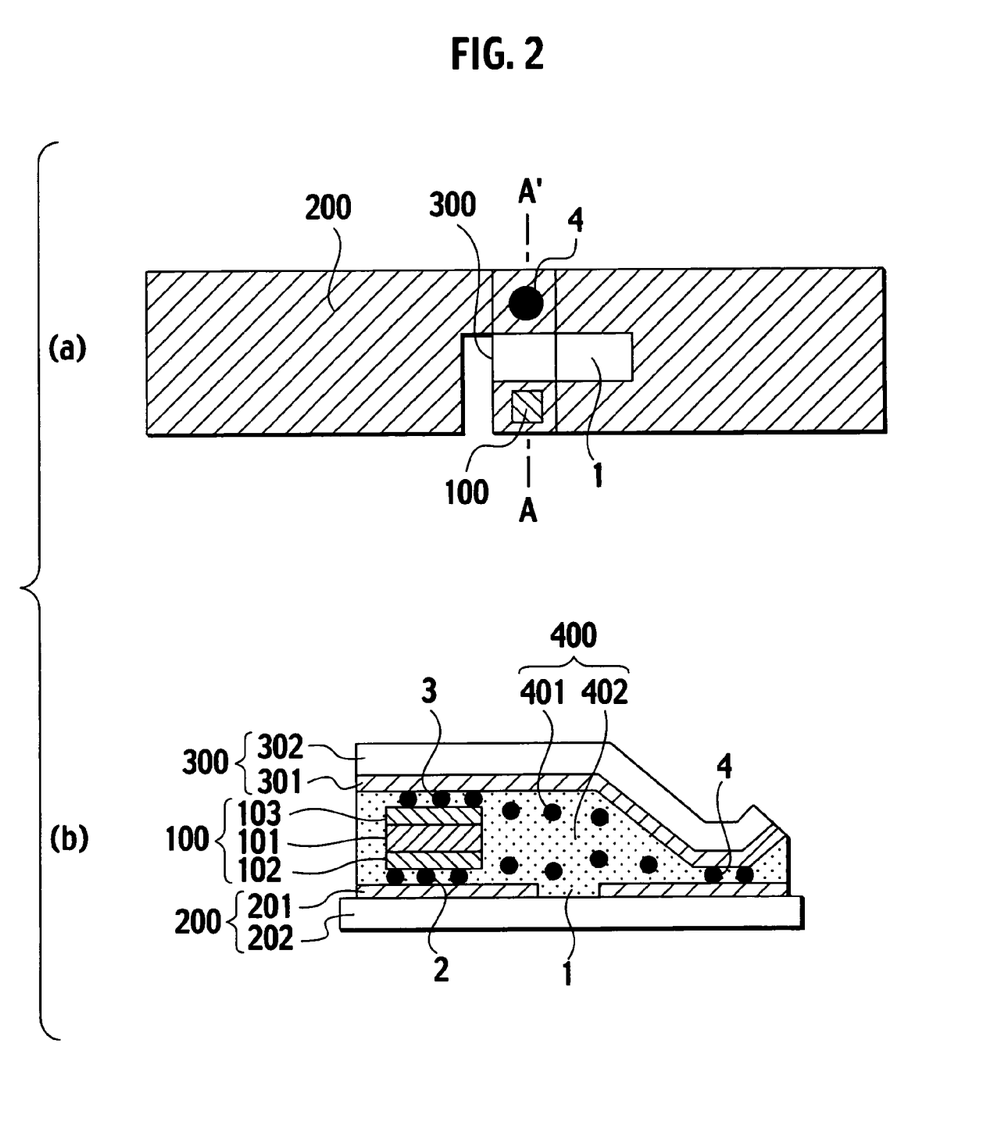
FIG. 2 shows the structure of an inlet obtained using the manufacturing method according to the present invention.

This electronic device is an inlet for an RFID tag that is manufactured using the manufacturing method of the present invention. FIG. 2 (a) provides a schematic view from above of the inlet for an RFID tag. FIG. 2 (b) is a cross-sectional schematic view of the part A-A' in FIG. 2 (a). A simple description of the structure of the inlet will now be provided using FIG. 2.

As shown in FIG. 2 (b), a first external electrode 102 and a second external electrode 103 are formed respectively on the respective surfaces of a pair of opposing faces of the IC chip 100. The IC chip 100 is connected to an antenna substrate 200 comprised of a base a substrate 202 and an antenna circuit 201 by the first external electrode 102 in a first connecting part 2 via conductive particles 401 contained in an anisotropic conductive adhesive layer 400. In the same manner, in a second connecting part 3 the bridging plate 300 comprised of a metallic film 301 and a base substrate 302 are connected to the second external electrode 103 of the IC chip 100, while in a third connecting part 4, the bridging plate 300 is connected to the antenna substrate 200, each of these connecting parts connecting respectively via the conductive particles 401 contained in the anisotropic conductive adhesive layer 400. The second connecting part 3 of the second external electrode 103 of the IC chip and the third connecting part 4 on the antenna substrate are connected spanning a slit formed in the antenna substrate. That is to say, the second external electrode 103 and the first external electrode 102 of the IC chip are electrically connected via the first connecting part 2, the antenna circuit 201, the third connecting part 4, the bridging plate metallic film 301 and the second connecting part 3. Further, the gap between the antenna substrate 200 and the bridging plate 300 is sealed by the matrix resin 402, an anisotropic conductive adhesive layer.

An example of the method of manufacture for this electronic device will now be described with reference to the drawings.

The first example of a manufacturing method for the electronic device according to the present invention is a manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the plurality of IC chips at once, to bridging plates having a second metallic film formed thereon via a first anisotropic conductive adhesive layer such that the plurality of the IC chips thus arranged are electrically connected, and producing bridging plates with the IC chips attached; a step of positionally aligning the bridging plates with IC chips attached in the determined position on the plurality of antenna circuits such that the plurality of the IC chips are electrically connected; and a step of thermal compression binding the bridging plates with IC chips attached at once in the determined positions on the antenna substrate via a second anisotropic conductive adhesive layer.

The second example of a manufacturing method for the electronic device according to the present invention is a manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the IC chips, via the first anisotropic conductive adhesive layer, after the plurality of the arranged IC chips have been positionally aligned at once, such that the plurality of the IC chips will be electrically connected in the determined positions with respect to the corresponding circuits of the plurality of antenna circuits on which they will be mounted; a step of positionally aligning the tentatively secured plurality of IC chips with bridging plates having a second metallic film so as to be electrically connected in the determined position on an antenna circuit; and a step of thermal compression binding the bridging plates at once on the plurality of the IC chips and the antenna substrate, via a second anisotropic conductive adhesive layer.

Further, the third example of a manufacturing method for the electronic device according to the present invention is a manufacturing method for an electronic device providing an IC chip having an external electrode formed respectively on each of the faces of an opposing pair, a transmission and reception antenna having a slit formed therein and a bridging plate that electrically connects the IC chip and the antenna, having at least a step of forming a plurality of antenna circuits using a first metallic film and forming an antenna substrate by disposing the antenna circuits on a base substrate, or a step of forming an antenna substrate by providing a plurality of antenna circuits from the first metallic film disposed on a base substrate; a step of forming a first anisotropic conductive adhesive layer in the determined position on the antenna circuit; a step of arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits on which the plurality of the IC chips will be mounted; a step of tentatively securing the IC chips, after the plurality of the IC chips arranged on the first anisotropic conductive adhesive layer have been positionally aligned at once, such that the plurality of the IC chips will be electrically connected in the determined positions with respect to the corresponding circuits of the plurality of antenna circuits on which they will be mounted; a step of forming a second anisotropic conductive adhesive layer in the determined position on the plurality of IC chips thus secured and the antenna circuits; a step of positionally aligning the tentatively secured plurality of IC chips with bridging plates having a second metallic film so as to be electrically connected in the determined position on an antenna circuit; and a step of thermal compression binding the bridging plates at once on the plurality of the IC chips and the antenna substrate.

In the first to third examples above, at least one of the first and second metallic films are aluminum. In the first to third examples above, at least one of the first and second metallic films is supported on an organic resin or a base substrate comprised of paper. This organic resin may be selected from polyvinyl chloride (PVC), acrylonitrile butadiene styrene (ABS), polyethylene terephthalate (PET), polyethylene terephthalate glycol (PETG), polyethylene naphthalate (PEN), polycarbonate resin (PC), biaxial polyester (O-PET), or polyimide resin.

In the first to third examples above, the method for forming the antenna substrate involves for example, using a first metallic film and forming a plurality of antenna circuits, then disposing the plurality of antenna circuits on a base substrate to form an antenna substrate, or disposing a first metallic film over a base substrate, then forming a plurality of antenna circuits thereon by etching or the like, to form an antenna substrate.

Figure 3:
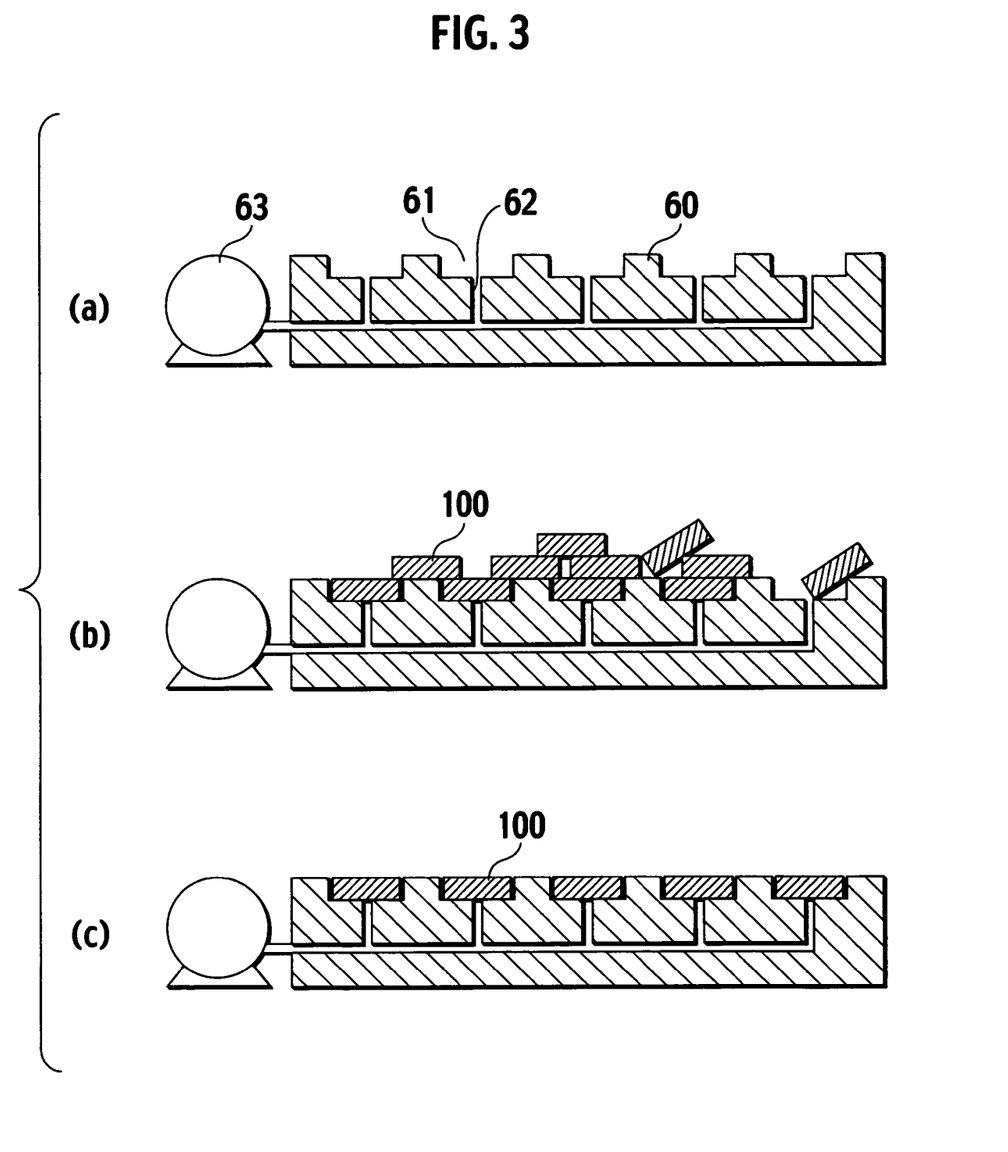
FIG. 3 depicts an arrangement from the arrangement method for IC chips according to the present invention.

In the first to third examples above, the method of arranging the IC chips involves for example, preparing a jig having from a few to several thousands of concavities of the appropriate dimensions to accommodate an IC chip formed in a metallic plate surface, providing a number of IC chips equal to or greater than the number of concavities on that jig, then making the jig shake such that the IC chips are accommodated in the concavities. In FIG. 3 a schematic example of a jig that uses this method of arrangement is shown. As shown in FIG. 3 (a), in the jig 60, 61 represents a concavity for accommodating the IC chip, 62 indicates an opening that allows vacuum suction and is disposed at the bottom of each of the concavities 62 and 63 indicates a vacuum bump. By performing vacuum suction together with shaking the jig an IC chip that has once become accommodated in a concavity is prevented from becoming detached by further shaking, further, after the IC chip has become accommodated in the concavity, surplus IC chips can easily be removed. The concavities are produced matching the form of the IC chip, the opening 62 for vacuum suction is formed smaller then the area of the IC chip thus the IC chip can be easily attached or removed. FIG. 3 (*b*) shows the condition with IC chips provided in the jig and FIG. 3 (*c*) shows the condition existing after the IC chips have been accommodated in the concavities, the surplus IC chips have been removed and the arrangement of the IC chips is complete.

Further, another method for arranging the IC chips involves for example a method of combining a chip condenser or a high speed bulk feeder or parts feeder that arranges chip components such as chip resistance or the like in a line, with a high-speed chip mounting device that mounts the components thus arranged in a line on a printed substrate or the like.

In this case the inlet can be produced as follows.

Here, for example, a plurality of the IC chips discharged from a high speed bulk feeder are arranged and tentatively secured, using a high-speed chip mounting device, on bridging plates having an anisotropic conductive adhesive layer attached, at intervals equivalent to the arrangement of the corresponding antenna circuit to be mounted, then mounting the bridging plate with IC chips attached at once in the determined position on the antenna substrate.

In the first to third examples above, if at least one of the plurality of IC chips that are arranged is positionally aligned corresponding to the determined position on the antenna circuit to be mounted, then the remaining IC chips can be disposed at once in the prescribed positions on the antenna circuit without the necessity of performing high precision positioning.

In the first to third examples above, a point of benefit is that when the method involves a step of dividing a bridging plate such that one piece is equivalent to the number of the IC chips in a line arranged in the widthwise direction of an antenna substrate, that can be subject to thermal compression binding at once, line by line, a step of positionally aligning the bridging plates in the determined position on an antenna circuit and a step of thermal compression binding of the bridging plates on the IC chips and the antenna substrate via an anisotropic conductive adhesive layer, then the available operating time can be reduced.

In the first to third examples above, an anisotropic conductive adhesive layer can be formed on the respective surfaces on which the external electrodes of an IC chip attach, and semiconductor elements of a condition in which the IC chip is enclosed between the anisotropic conductive adhesive layers can be used, in which case the inlet can be produced with greater efficiency.

In the first to third examples above, the thermal compression binding of the first and second anisotropic conductive adhesive layers thermally press seals the plurality of the IC chips with the antenna substrate and bridging plate at once, and seals the gap between the antenna substrate and bridging plate.

In this case, making the total thickness of the first and second anisotropic conductive adhesive layers not less than half the thickness of an IC chip enables a ceiling to be realized between the antenna substrate and bridging plate and provides a high degree of reliability.

Dividing the bridging plate into a plurality of pieces prior to the thermal compression binding enables prevention of positional misalignment due to heat warp.

In the first to third examples above, an anisotropic conductive adhesive layer can be formed on the respective surfaces on which the external electrodes of an IC chips attaches, while another bridging plate can be disposed in advance on the surface of one of the anisotropic conductive adhesive layers of the semiconductor elements of the condition in which the IC chip has been enclosed between the anisotropic conductive adhesive layers, this enabling the inlet to be produced with still greater efficiency.

In the first to third examples above, a method for disposing a second metallic film for forming a bridging plate on a base substrate involves for example, a method in which a second metallic film is simply adhered on the base substrate, and with no necessity of performing processes such as etching or the like for the second metallic film, the process is completed swiftly, enabling the available operating time to be reduced and thereby realizing lower costs.

In the first to third examples above, after the process in which bridging plates are thermal compression bound at once together with the IC chips and on the antenna substrate via anisotropic conductive adhesive layers, a process is performed in which a continuum of antenna circuits is cut into individual pieces one by one.

In the first to third examples above, in the cutting process, when they line A-A' in FIG. 2 is taken as the widthwise direction, the bridging plate must have length sufficient to span the slit and reach the IC chip, while having length substantially equivalent to the width of the antenna circuit is preferable for enhancing the overall external appearance of the inlet.

In the first to third examples above, an inlet structure that is the electronic device according to the present invention can be obtained by performing each of the above steps.

An advantageous point about this inlet is that when used in the form of an RFID tag, providing a cover sheet above and below the inlet protects the circuit and prevents short-circuiting.

In the first to third examples above, arranging a plurality of the IC chips and securing them at once together on bridging plates and antenna substrate enables realization of a superior method of manufacture in comparison to mounting the IC chips one by one. Raising productivity enables a reduction in the available operating time per inlet.

In the first to third examples above, using the IC chips and bridging plate and making a connective structure that spans a slit, renders unnecessary high precision positional alignment of the external electrode on the face on that side of the IC chip that contacts the antenna circuit with the stimulation slit on the antenna circuit, and the IC chips can be satisfactorily mounted at once together on an antenna substrate even after relatively rough positional alignment of the IC chips arranged using a sieve or mold.

In the first to third examples above, each of the electric connections of the IC chips with the antenna substrate and bridging plate, and the bridging plate and the antenna substrate, are made via an anisotropic conductive adhesive layer. These connections via an anisotropic conductive adhesive layer are obtained by the contact between each of the external electrodes formed on each of the surfaces of the IC chip that provides the connective body, with conductive particles included within the anisotropic conductive adhesive layer, while the non-necessity of a surface coating over the antenna substrate, and the non-necessity of a highly heat resistant base substrate that can withstand bonding at temperatures of above 200° C. in order to form a metallic connection, mean that it is possible to use a cheap base material and antenna circuit, thereby enabling cost reductions.

As the above described electric connection is made via an anisotropic conductive adhesive layer, in contrast to the case of the conventional art in which for example it is necessary when making a connection by a gold-tin alloy or the like to use a highly heat resistant polyimide as the base material for the antenna substrate, it is possible to use cheaper polyethylene terephthalate. Further, as it is not necessary to use tin plating on the surface over the antenna circuit at the connecting part, it is possible to use the cheaper aluminum that does not conform well with a tin or solder coating as the material for the antenna circuit. Accordingly, an antenna substrate made by forming an aluminum antenna circuit on a polyethylene terephthalate base substrate is a satisfactory member for the manufacture of an inlet for a cheap RFID tag.

In the first example above, the first anisotropic conductive adhesive layer can be formed in advance on the bridging plate, or it can be formed on the second external electrode side of the IC chip. Again, the second anisotropic conductive adhesive layer can be formed in advance on the antenna substrate or it may be formed on the first external electrode 102 side of the IC chip.

In the second example above the first anisotropic conductive adhesive layer can be formed in advance on the antenna substrate, or it can be formed on the first external electrode side of the IC chip. Again, the second anisotropic conductive adhesive layer can be formed in advance on the bridging plate or it may be formed on the IC chip and antenna circuit.

In the first to third examples above if at least one of the plurality of IC chips that are arranged is positionally aligned corresponding to the determined position on the antenna circuit to be mounted, then the remaining IC chips can be disposed at once and together in the prescribed positions on the antenna circuit without the necessity of performing high precision positioning.

The manufacturing method for an electronic device according to the present invention is a manufacturing method for an electronic device providing an IC chip having an external electrode formed respectively on each of the faces of the opposing pair, a transmission and reception antenna having a slit formed therein and a bridging plate that electrically connects the IC chip and the antenna, in which if at least one of the plurality of IC chips that are arranged is positionally aligned corresponding to the determined position on the antenna circuit to be mounted, then the remaining IC chips can be disposed at once and together in the prescribed positions on the antenna circuit without the necessity of performing high precision positioning.

In the description of the first to third examples above after a plurality of the IC chips are arranged, the IC chips are secured at once in order to make the electrical connection between the IC chips and bridging plates and antenna substrate, thereby realizing dramatically improved productivity of the inlet.

EMBODIMENTS

Exemplary embodiments of the present invention will now be described with reference to the drawings, provided it is understood that the invention is not limited thereby and the following description is illustrative rather than restrictive.

FIG. 2 (*a*) shows an embodiment of the present invention, providing a schematic view from above of an inlet for an RFID tag manufactured using the manufacturing method of the present invention. FIG. 2 (*b*) is a cross-sectional schematic view of the part A-A' in FIG. 2 (*a*). A simple description of the structure of the inlet will now be provided using FIG. 2.

As shown in FIG. 2 (*b*), a first external electrode 102 and a second external electrode 103 are formed respectively on the respective surfaces of the pair of opposing faces of the IC chip 100. The IC chip 100 is connected to an antenna substrate 200 comprised of a base substrate 202 and an antenna circuit 201 by the first external electrode 102 in a first connecting part 2 via conductive particles 401 contained in an anisotropic conductive adhesive layer 400. In the same manner, in a second connecting part 3 the base substrate 302 and bridging plate 300 comprised of a metallic film 301 are connected to the second external electrode 103 of the IC chip 100, while in a third connecting part 4 the bridging plate 300 is connected to the antenna substrate 200, each of these connecting parts connecting respectively via the conductive particles 401. That is to say, the second connecting part 3 of the second external electrode 103 of the IC chip and the third connecting part 4 on the antenna substrate are connected spanning a slit formed in the antenna substrate. The second external electrode 103 and the first external electrode 102 of the IC chip are electrically connected via the first connecting part 2, the antenna circuit 201, the third connecting part 4, the bridging plate metallic film 301 and the second connecting part 3. Further, the gap between the antenna substrate 200 and the bridging plate 300 is sealed by a matrix resin 402, an anisotropic conductive adhesive layer.

Embodiment 1

A first embodiment of the present invention will now be described with reference to FIG. 4.

Figure 4:
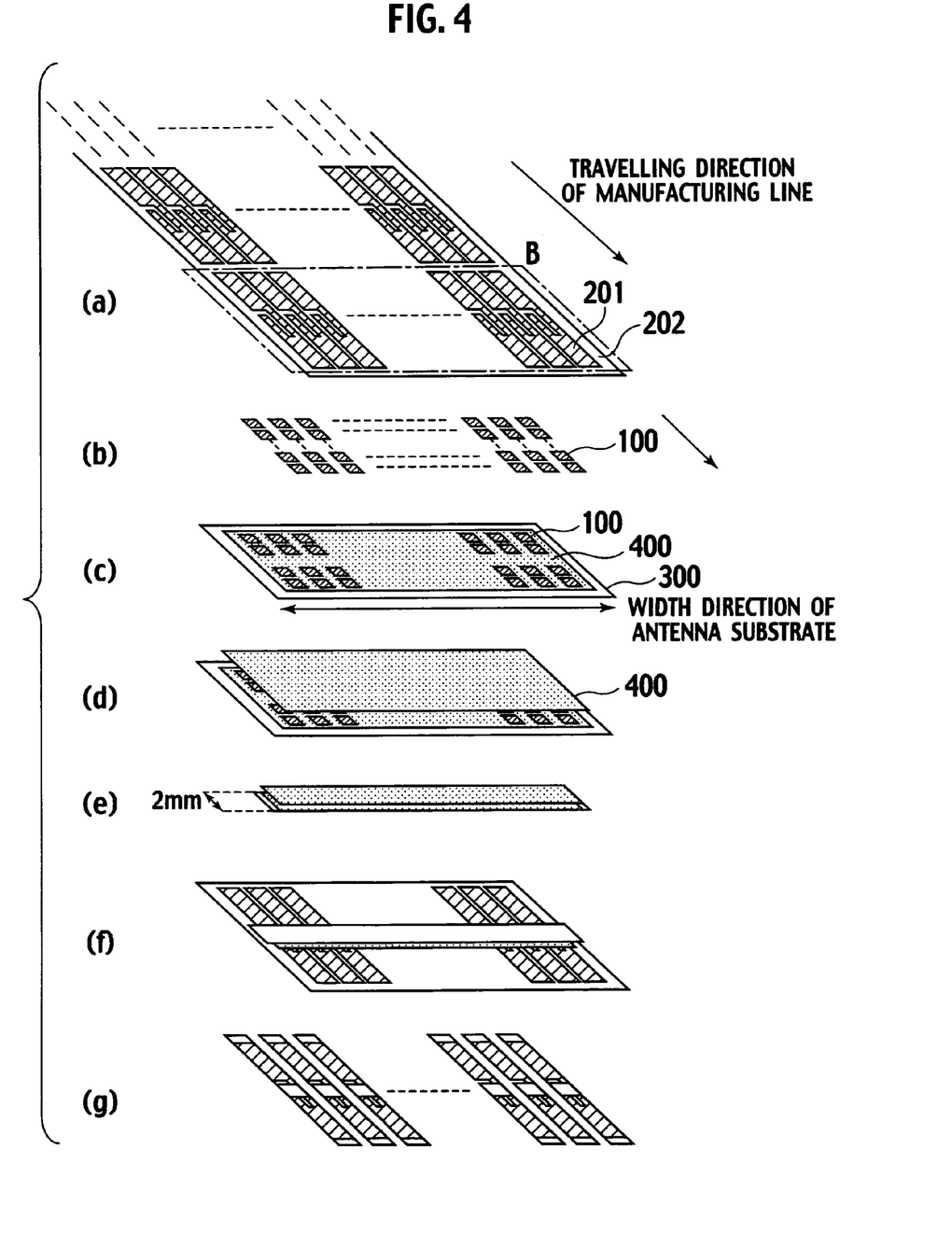
FIG. 4 shows the manufacturing steps describing the first embodiment of the present invention.

As shown in FIG. 4 (*a*), an etching resist is formed by screen printing on an aluminum film surface of a tape form substrate produced by adhering aluminum film of a thickness of 9 μm to a polyethylene terephthalate substrate 202 of a thickness of 50 μm using an adhesive agent. Next, an antenna circuit 201 is formed continuously on the aluminum film surface using ferric chloride solution as an etching liquid. Here, the antenna thickness for each antenna circuit is 2.5 mm, the thickness of the slit is 0.5 mm, and the antenna circuits are formed at a pitch of 3 mm. In accordance with the layout of the drawing, only the part designated as B are depicted in the processes described hereinbelow.

As shown in FIG. 4 (*b*), approximately 10000 IC chips 100 each having a thickness of 0.15 mm and a length and width both of 0.4 mm and having an external electrode formed respectively on the faces of each of the opposing pair of faces thereof are prepared. Next, a jig is prepared having formed in the metallic plate surface thereof for the purpose of accommodating the IC chips, a total of 2000 concavities, these consisting of 40 concavities disposed at a 3 mm pitch in the horizontal direction (the widthwise direction in relation to the traveling direction of the manufacturing line) and 50 concavities disposed at a 2 mm pitch in the lengthwise direction (the traveling direction of the manufacturing line). Then, after supplying approximately 10000 of the IC chips on the jig the chips are arranged accommodated in each of the concavities by vibrating the jig for approximately 60 seconds. At this time, as an opening has been provided in the bottom of each of the concavities to facilitate vacuum suction, vacuum suction is performed concomitant with the vibrating action applied to the jig, thus an IC chip that has once become accommodated in a concavity is prevented from becoming detached by further vibration and after one of the IC chips has become accommodated in each concavity the surplus IC chips are removed using a brush.

Thereafter, as shown in FIG. 4 (c), an anisotropic conductive adhesive layer is formed on the aluminum film surface of a bridging plate 300, which is formed by adhering aluminum film of a thickness of 9 μm using adhesive agent in place on a substrate of polyethylene terephthalate having a thickness of 50 μm, by lamination at a temperature of 80° C. of an anisotropic conductive adhesive film 400 (AC-2052P-45 by Hitachi Chemical) having a width of 110 mm, and then removal of the separator film. With the IC chips vacuum sucked on to the anisotropic adhesive diffusion layer the jig is inverted and the vacuum suction stopped, such that one of the surfaces from among the respective surfaces of each of the 2000 IC chips having an external electrode attached thereto is made the bottom and the 2000 chips are arranged in this condition at once.

Next, as shown in FIG. 4 (d), after the anisotropic conductive adhesive film 400 is laminated at a temperature of 80° C. over the surface having an external electrode attached thereto on the opposite side to the external electrode of the side of the IC chip arranged closest to the bridging plate, the separator film is then removed to form an anisotropic conductive adhesive layer, thus making a bridging plate with IC chip attached. At this time, the respective surfaces of the IC chips each having an external electrode attached thereto are in a condition sandwiched between the anisotropic conductive adhesive layers.

Next, as shown in FIG. 4 (e), the bridging plate with IC chip attached is cut into pieces each having a width of 2 mm so as to be mounted in the width direction of an antenna substrate, thereby dividing the bridging plate into bridging plates with IC chips attached having 40 IC chips arranged in a line at a pitch of 3 mm.

Thereafter, as shown in FIG. 4 (f) using a CCD camera and image processing device, the IC chips viewed from above the anisotropic conductive adhesive layer of the bridging plates thus divided and with the IC chips attached, are positionally aligned with respect to the determined position on an antenna circuit, and the IC chips of the bridging plates with IC chips attached are thus tentatively secured in the correct position for connection to the antenna substrate. At this time, it is sufficient for just one of the IC chips to be positionally aligned with the desired position on the antenna circuit using the CCD camera and image processing device, as this enables the remaining 39 IC chips to be arranged at once in the determined position on the antenna circuits without high precision positional alignment performed using the CCD camera and image processing device. Further, instead of using a CCD camera and image processing device, it should be no problem to position the IC chip with precision by visual observation from above the anisotropic conductive adhesive layer. Thereafter, a press applying head is lowered from the bridging plate side, and the bridging plate with IC chip attached is thermally compression bound at once in the determined position with respect to one row of an antenna circuit arranged in the widthwise direction of an antenna substrate at a pressure of 3 MPa, at 180° C. with the heat being applied for 15 seconds, while the gaps between the antenna substrate and the bridging plate are sealed. The same processes are applied with respect to the remaining 49 rows of bridging plates on the antenna substrate which are subject to thermal compression binding to the antenna substrate. A protrusion having the thickness of the IC chip is formed in the determined position on the press applying head such that the connection of the IC chip and the antenna substrate with the bridging plate and the connection of the bridging plate with the antenna substrate can be performed simultaneously. Next, as shown in FIG. 4 (g) a press cutting machine is used to cut the arrangement into individual pieces thereby obtaining the inlet construction of the form as shown in FIG. 2.

By using the above described processes the time required for the arrangement of the IC chips is 0.03 seconds per inlet while the time required for connection of the bridging plates with the IC chips attached to the antenna substrate is 0.375 seconds per inlet. Where a plurality of pressing heads are used the available operating time per inlet can be further reduced.

Further, the precision achieved in the position of the mounting of the IC chips is kept within plus or minus sign 0.3 mm of the prescribed position and no detrimental effects in assembly or affecting transmission occur due to positional misalignment.

That is to say, in this method of arranging IC chips on bridging plates at the same intervals as the arrangement of the chips on and antenna circuit on which the chips will be mounted and then dividing the bridging plate into pieces each of which corresponds to the number of IC chips that can be subject to thermal compression binding at once, the IC chips or the anisotropic conductive adhesive layer may be disposed on the antenna circuit.

Embodiment 2

A second embodiment of the present invention will now be described with reference to FIG. 5.

Figure 5:
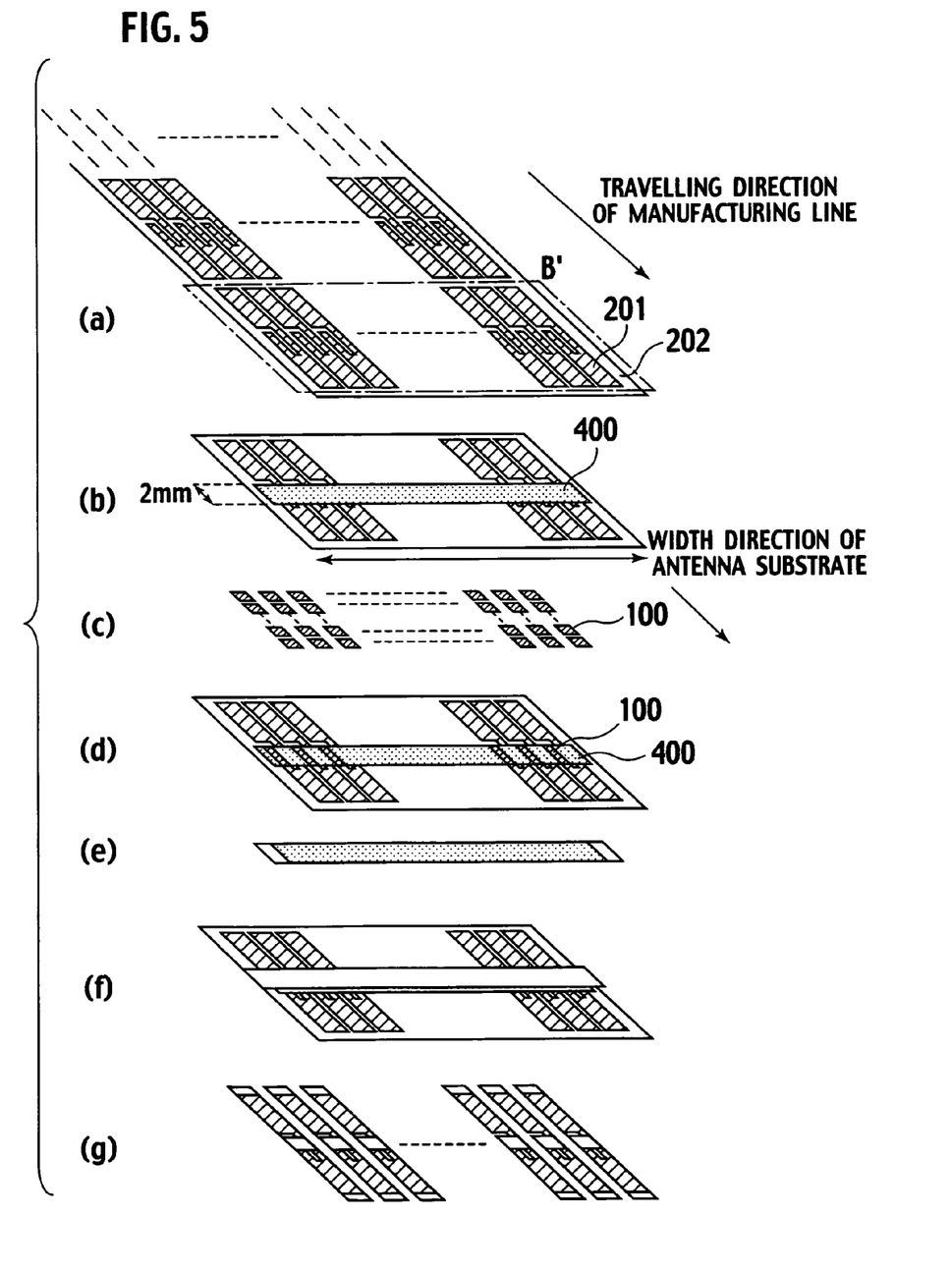
FIG. 5 shows the manufacturing steps describing the second embodiment of the present invention.

As shown in FIG. 5 (a), an etching resist is formed by screen printing on an aluminum film surface of a tape form substrate produced by adhering aluminum film of a thickness of 9 μm to a polyethylene terephthalate substrate 202 of a thickness of 50 μm using an adhesive agent. Next, a continuum of antenna circuits 201 is formed on the aluminum film surface using ferric chloride solution as an etching liquid. Here, the antenna thickness for each antenna circuit is 2.5 mm, the width of the slit is 0.5 mm, and the antenna circuits are formed at a pitch of 3 mm. In accordance with the layout of the drawing, only the part designated as B' are depicted in the processes described hereinbelow.

Next, as shown in FIG. 5 (b) an anisotropic conductive adhesive layer is formed in the determined position on an antenna circuit by lamination at a temperature of 80° C. of an anisotropic conductive adhesive film 400 (AC-2052P-45 by Hitachi Chemical) having a width of 2 mm, and then removal of the separator film.

Then, as shown in FIG. 5 (c), approximately 10000 IC chips 100 each having a thickness of 0.15 mm and a length and width both of 0.4 mm and having an external electrode formed respectively on the faces of each of an opposing pair of faces thereof are prepared. Next, a jig is prepared having formed in the metallic plate surface thereof for the purpose of accommodating the IC chips, a total of 2000 concavities, these consisting of 40 concavities disposed at a 3 mm pitch in the horizontal direction (the widthwise direction in relation to the traveling direction of the manufacturing line) and 50 concavities disposed at a 2 mm pitch in the lengthwise direction (the traveling direction of the manufacturing line). Then, after supplying approximately 10000 of the IC chips on the jig the chips are arranged accommodated in each of the concavities by vibrating the jig for approximately 60 seconds. At this time, in the same manner as applied with respect to embodiment 1, as an opening has been provided in the bottom of each of the concavities to facilitate vacuum suction, vacuum suction is performed concomitant with the vibrating action applied to the jig, thus an IC chip that has once become accommodated in a concavity is prevented from becoming detached by further vibration and after one of the IC chips has become accommodated in each concavity the surplus IC chips are removed using a brush.

Thereafter, as shown in FIG. 5 (d), with just the 40 IC chips of one horizontal row from among the IC chips thus arranged being subject to vacuum suction, the jig is inverted and using a CCD camera and image processing device, the IC chips are positionally aligned with respect to the determined position on an antenna circuit, before the vacuum suction is stopped, with the IC chips now tentatively secured. At this time, it is sufficient for just one of the IC chips to be positionally aligned with the desired position on the antenna circuit using the CCD camera and image processing device, as this enables the remaining 39 IC chips to be arranged at once in the determined position on the antenna circuit without high precision positional alignment performed using the CCD camera and image processing device.

Thereafter, as shown in FIG. 5 (e), on the aluminum film surface of a tape form substrate of 2 mm widthwise, which is formed by adhering aluminum film of a thickness of 9 μm using adhesive agent in place on a substrate of polyethylene terephthalate having a thickness of 50 μm, the anisotropic conductive adhesive film 400 having the same width as that tape perform substrate is laminated at 80° C., then the separator film is removed making a bridging plate with anisotropic conductive adhesive layer attached.

Thereafter, as shown in FIG. 5 (f), the bridging plate with anisotropic conductive adhesive layer attached and an antenna substrate are aligned in the determined position based on the respective external dimensions of those, and tentatively secured. A press applying head is lowered from the anisotropic conductive adhesive layer attached side of the bridging plate, and the bridging plate with the anisotropic conductive adhesive layer attached is thermally compression bound at once in the determined position with respect to one row of the antenna circuit and the IC chips arranged in the widthwise direction of the antenna substrate at a pressure of 3 MPa, at 180° C. with the heat being applied for 15 seconds, while the gaps between the antenna substrate and the bridging plate are sealed. The same processes are applied with respect to the remaining 49 rows of bridging plates on the antenna substrate which are subject to thermal compression binding to the antenna substrate. A protrusion having the thickness of the IC chip is formed in the determined position on the press applying head such that the connection of the IC chip and the antenna substrate with the bridging plate and the connection of the bridging plate with the antenna substrate can be performed simultaneously.

Next, as shown in FIG. 5 (g), a press cutting machine is used to cut the arrangement into individual pieces thereby obtaining the inlet construction of the form as shown in FIG. 2 and FIG. 3.

In the same manner as applies with respect to embodiment 1, by using the above described processes the time required for the arrangement of the IC chips is 0.03 seconds per inlet while the time required for connection of the bridging plate to the antenna substrate is 0.375 seconds per inlet. Where a plurality of pressing heads are used the available operating time per inlet can be further reduced.

Further, in the same manner as applies with respect to embodiment 1, the precision achieved in the position of the mounting of the IC chips is kept within plus or minus sign 0.3 mm of the prescribed position and no detrimental effects in assembly or affecting transmission occur due to positional misalignment. That is to say, in this method of arranging IC chips on a bridging plate at the same intervals as the arrangement of the chips on and antenna circuit on which the chips will be mounted and then dividing the bridging plate into pieces each of which corresponds to the number of IC chips that can be subject to thermal compression binding at once, the IC chips or the anisotropic conductive adhesive layer may be disposed on the antenna circuit.

Embodiment 3

The third embodiment will now be described.

FIG. 5 (a) to FIG. 5 (d) depict usage of the same processes as are used with respect to embodiment 2, involving processing of the antenna substrate, laminating the anisotropic conductive adhesive film on the antenna circuit and forming the anisotropic conductive adhesive layer, arranging the IC chips having the external electrode formed on each of the surfaces of the pair of opposing surfaces and then tentatively securing the IC chips in the determined position on the antenna circuit in relation to one row arranged in the widthwise direction of the antenna substrate.

Next, an anisotropic conductive adhesive film of the same width as the above laminated anisotropic conductive adhesive film is laminated at 80° C. over the tentatively secured IC chips, and the separator film is then removed thus forming an anisotropic conductive adhesive layer.

Then, a tape form substrate 2 mm wide is prepared, by adhering aluminum film of a thickness of 9 μm on a polyethylene terephthalate substrate 50 μm thick using adhesive, thus making a bridging plate. With the aluminum film surface side of the bridging plate opposing the IC chips, the bridging plate and the IC chips are positionally aligned so as to overlay the anisotropic conductive adhesive film, with the external dimensions in agreement and the IC chips are tentatively secured. Thereafter, a press applying head is lowered from the bridging plate side, and the bridging plate with IC chips attached is thermally compression bound at once in the determined position with respect to one row of the IC chips and antenna circuit arranged in the widthwise direction of an antenna substrate at a pressure of 3 MPa, at 180° C. with the heat being applied for 15 seconds, while the gaps between the antenna substrate and the bridging plate are sealed. The same processes are applied with respect to the remaining 49 rows of bridging plates on the antenna substrate which are subject to thermal compression binding to the antenna substrate. A protrusion having the thickness of the IC chip is formed in the determined position on the press applying head such that the connection of the IC chips and the antenna substrate with the bridging plate and the connection of the bridging plate with the antenna substrate can be performed simultaneously.

Next, a press cutting machine is used to cut the arrangement into individual pieces thereby obtaining the inlet construction of the form as shown in FIG. 2.

In the same manner as applies with respect to embodiment 1 and embodiment 2, by using the above described processes the time required for the arrangement of the IC chips is 0.03 seconds per inlet while the time required for connection of the bridging plate to the antenna substrate is 0.375 seconds per inlet. Where a plurality of pressing heads is used the available operating time per inlet can be further reduced.

Further, in the same manner as applies with respect to embodiment 1 and embodiment 2, the precision achieved in the position of the mounting of the IC chips is kept within plus or minus sign 0.3 mm of the prescribed position and no detrimental effects in assembly or affecting transmission occur due to positional misalignment. That is to say, in this method of arranging IC chips on bridging plates at the same intervals as the arrangement of the chips on and antenna circuit on which the chips will be mounted and then dividing the bridging plate into pieces each of which corresponds to the number of IC chips that can be subject to thermal compression binding processing at once, the IC chips or the anisotropic conductive adhesive layer may be disposed on the antenna circuit.

A summary of the results of the above embodiments are shown in Table 1.

TABLE 1

| EMBODIMENT | TIME FOR ALIGHMENT (SECOND/ PIECE) | TIME FOR CONNECTION (SECOND/ PIECE) | DEFECTS IN ASSEMBLY (DEFECTS NO/ TOTAL NO) | DEFECTS IN COMMUNICATION (DEFECTS NO/ TOTAL NO) |
|---|---|---|---|---|
| FIRST EMBODIMENT | 0.03 | 0.375 | 0/2000 | 0/2000 |
| SECOND EMBODIMENT | 0.03 | 0.375 | 0/2000 | 0/2000 |
| THIRD EMBODIMENT | 0.03 | 0.375 | 0/2000 | 0/2000 |

The invention claimed is:

1. A manufacturing method for an electronic device providing an IC chip having an external electrode formed respectively on each of the faces of an opposing pair of faces, a transmission and reception antenna having a slit formed therein and a bridging plate that electrically connects the IC chip and the antenna, having at least the steps of:

forming a plurality of antenna circuits using a first metallic film and forming an antenna substrate by disposing the antenna circuits on a base substrate, or forming an antenna substrate by providing a plurality of antenna circuits from the first metallic film disposed on a base substrate;

arranging in at least one of a longitudinal orientation or a horizontal orientation, a plurality of the IC chips, with the same intervals therebetween as are required when the plurality of the IC chips are arranged in determined positions with respect to the corresponding circuits of the plurality of antenna circuits that the plurality of the IC chips is mounted thereon;

tentatively securing the plurality of IC chips at once, to bridging plates having a second metallic film formed thereon via a first anisotropic conductive adhesive layer such that the plurality of the IC chips thus arranged are electrically connected, and producing bridging plates with the IC chips attached;

positionally aligning the bridging plates with IC chips attached in the determined position on the plurality of antenna circuits such that the plurality of the IC chips are electrically connected; and performing thermal compression binding that joins the bridging plates with IC chips attached at once in the determined positions on the antenna substrate via a second anisotropic conductive adhesive layer.

2. A method of manufacturing an electronic device that includes (1) an IC chip having two external electrodes, the external electrodes being formed respectively on one and the other of the faces of an opposing pair of faces of the IC chip, (2) a transmission and reception antenna having a slit formed therein, and (3) a bridging plate that electrically connects the IC chip and the antenna, the transmission and reception antenna being on a base substrate, the method comprising:

arranging a plurality of IC chips in at least one of a longitudinal orientation or a horizontal orientation;

positionally aligning at least one of the plurality of IC chips at a position corresponding to a determined position on an antenna circuit on which the at least one of the plurality of IC chips is being mounted, the at least one of the plurality of IC chips being positioned onto an anisotropic conductive adhesive layer; and performing thermal compression bonding that joins the bridging plate on the transmission and reception antenna such that the bridging plate spans the slit and electrically connects the IC chip and the antenna.

3. The method of manufacturing an electronic device according to claim 2, wherein the arranging the plurality of the IC chips in at least one of a longitudinal orientation or a horizontal orientation, includes using a jig having concavities of appropriate dimensions to accommodate an IC chip, providing the plurality of IC chips on the jig, and then shaking the jig such that the IC chips on the jig are accommodated in the concavities, with the concavities of the jig having the same intervals therebetween as are required when the plurality of the IC chips are arranged in determined positions with respect to the corresponding circuits of the plurality of antenna circuits that the plurality of the IC chips are to be mounted upon, whereby the plurality of IC chips are arranged at a same time.

4. The method of manufacturing an electronic device according to claim 2, wherein the thermal compression bonding joins the bridging plate and the IC chip with a substrate of the antenna.

5. The method of manufacturing an electronic device according to claim 2, further comprising:

dividing a bridging plate such that one piece is equivalent to the number of the IC chips in a line arranged in the widthwise direction of an antenna substrate, that can be subject to thermal compression bonding at once, line by line;

positionally aligning bridging plates with one row of antenna circuits arranged in the widthwise direction of an antenna substrate; and performing thermal compression bonding that joins the bridging plates on the IC chips and the antenna substrate via an anisotropic conductive adhesive layer.

6. The manufacturing method of an electronic device according to claim 5, wherein after the process in that the plurality of IC chips are thermal compression bonded at once with the antenna substrate and the bridging plates, a process is performed in that a continuum of antenna circuits is cut into individual pieces.

7. The manufacturing method of an electronic device according to claim 5, wherein thermal compression bonding is performed that joins the bridging plates and the IC chips with the antenna substrate.

8. A method of manufacturing an electronic device that includes (1) an IC chip having two external electrodes, the external electrodes being formed respectively on one and the other of the faces of an opposing pair of faces of the IC chip, (2) a transmission and reception antenna having a slit formed therein, the transmission and reception antenna being on a base substrate, and (3) a bridging plate that electrically connects the IC chip and the antenna, the method comprising:

forming a plurality of antenna circuits that include a first metallic film and forming an antenna substrate by disposing the antenna circuits on the base substrate; or forming an antenna substrate by providing a plurality of antenna circuits, by etching, from the first metallic film deposited on the base substrate;

arranging a plurality of the IC chips in at least one of a longitudinal orientation or a horizontal orientation, with a same interval therebetween as is required when the plurality of the IC chips are arranged in determined positions with respect to corresponding circuits of the plurality of antenna circuits that the plurality of the IC chips are to be mounted upon;

securing the plurality of IC chips at once, to bridging plates having a second metallic film formed thereon via a first anisotropic conductive adhesive layer such that the plurality of the IC chips thus arranged are electrically connected, thereby producing bridging plates with the IC chips attached;

positionally aligning the bridging plates with IC chips attached in the determined positions on the plurality of antenna circuits, such that the plurality of the IC chips are electrically connected; and performing thermal compression bonding that joins the bridging plates with IC chips attached at once in the determined positions on the antenna substrate via a second anisotropic conductive adhesive layer, such that the bridging plate spans the slit and electrically connects the IC chip and the antenna.

9. The method of manufacturing an electronic device according to claim 8, wherein at least one of the first metallic film and the second metallic film is aluminum.

10. The method of manufacturing an electronic device according to claim 8, wherein at least one of the first metallic film and the second metallic film is supported on a base substrate of an organic resin, said organic resin being selected from the group consisting of polyvinyl chloride (PVC), acrylonitrile butadiene styrene (ABS), polyethylene terephthalate (PET) polyethylene terephthalate glycol derivative (PETG), polyethylene naphthalate (PEN), polycarbonate resin (PC), biaxial polyester (O-PET), and polyimide resin.

11. The method of manufacturing an electronic device according to claim 8, wherein at least one of the first metallic film and the second metallic film is supported on a base substrate comprised of paper.

12. The method of manufacturing an electronic device according to claim 8, wherein gaps between the antenna substrate and bridging plate are sealed by thermal compression bonding of the first and second anisotropic conductive adhesive layers.

13. The method of manufacturing an electronic device according to claim 8, wherein after the process in that the plurality of IC chips are thermal compression bonded at once with the antenna substrate and the bridging plates, a process is performed in that a continuum of antenna circuits is cut into individual pieces.

14. The manufacturing method of an electronic device according to claim 8, wherein gaps between the antenna substrate and bridging plate are sealed by thermal compression bonding of the first and second anisotropic conductive adhesive layers.

15. The manufacturing method of an electronic device according to claim 8, wherein after the process in that the plurality of IC chips are thermal compression bonded at once with the antenna substrate and the bridging plates, a process is performed in that a continuum of antenna circuits is cut into individual pieces.

16. The manufacturing method of an electronic device according to claim 8, wherein thermal compression bonding is performed that joins the bridging plates and the IC chips with the antenna substrate.

17. A method of manufacturing an electronic device that includes (1) an IC chip having two external electrodes, the external electrodes being formed respectively on one and the other of the faces of an opposing pair of faces of the IC chip, (2) a transmission and reception antenna having a slit formed therein, the transmission and reception antenna being on a base substrate, and (3) a bridging plate that electrically connects the IC chip and the antenna, the method comprising:

forming a plurality of antenna circuits that include a first metallic film and forming an antenna substrate by disposing the antenna circuits on a base substrate; or forming the antenna substrate by providing a plurality of antenna circuits, by etching, from the first metallic film deposited on the base substrate;

arranging in at least one of a longitudinal orientation or a horizontal orientation, a plurality of the IC chips, with a same interval therebetween as is required when the plurality of the IC chips are arranged in determined positions with respect to the corresponding circuits of the plurality of antenna circuits that the plurality of the IC chips are to be mounted upon;

tentatively securing the IC chips, via a first anisotropic conductive adhesive layer, after the plurality of the arranged IC chips have been positionally aligned at once, such that the plurality of the IC chips are electrically connected in the determined positions with respect to the corresponding circuits of the plurality of antenna circuits that the plurality of the IC chips are mounted upon;

positionally aligning the tentatively secured plurality of IC chips with bridging plates having a second metallic film so as to be electrically connected in the determined position on an antenna circuit; and performing thermal compression bonding that joins the bridging plates at once on the plurality of the IC chips and the antenna substrate, via a second anisotropic conductive adhesive layer such that the bridging plate spans the slit and electrically connects the IC chip and the antenna.

18. A method of manufacturing an electronic device that includes (1) an IC chip having two external electrodes, the external electrodes being formed respectively on one and the other of the faces of an opposing pair of faces of the IC chips, (2) a transmission and reception antenna having a slit formed therein, the transmission and reception antenna being on a base substrate, and (3) a bridging plate that electrically connects the IC chip and the antenna, the method comprising:

forming a plurality of antenna circuits that include a first metallic film and forming an antenna substrate by disposing the antenna circuits on a base substrate; or forming the antenna substrate by providing a plurality of antenna circuits, by etching, from the first metallic film deposited on the base substrate;

forming a first anisotropic conductive adhesive layer in a determined position on an antenna circuit of the plurality of antenna circuits;

arranging in at least one of a longitudinal orientation or a horizontal orientation, a plurality of the IC chips, with a same interval therebetween as is required when the plurality of the IC chips are arranged in determined positions with respect to the corresponding circuits of the plurality of antenna circuits that the plurality of the IC chips are to be mounted upon, the plurality of the IC chips being arranged on the first anisotropic conductive adhesive layer;

tentatively securing the IC chips, after the plurality of the IC chips arranged on the first anisotropic conductive adhesive layer have been positionally aligned at once, such that the plurality of the IC chips are electrically connected in the determined positions with respect to the corresponding circuits of the plurality of antenna circuits that the plurality of IC chips are mounted upon;

forming a second anisotropic conductive adhesive layer in determined positions on the plurality of IC chips thus tentatively secured and the antenna circuits;

positionally aligning the tentatively secured plurality of IC chips with bridging plates having a second metallic film so as to be electrically connected in the determined position on an antenna circuit; and performing thermal compression bonding that joins the bridging plates at once on the plurality of the IC chips and the antenna substrate such that the bridging plate spans the slit and electrically connects the IC chip and the antenna.

19. The manufacturing method of an electronic device according to claim 18, wherein at least one of the first metallic film and the second metallic film is supported on a base substrate of an organic resin, this organic resin being selected from the group consisting of polyvinyl chloride (PVC), acrylonitrile butadiene styrene (ABS), polyethylene terephthalate (PET), polyethylene terephthalate glycol derivative (PETG), polyethylene naphthalate (PEN), polycarbonate resin (PC), biaxial polyester (O-PET), and polyimide resin.

20. The manufacturing method of an electronic device according to claim 18, wherein at least one of the first metallic film and the second metallic film is supported on a base substrate comprised of paper.

21. The manufacturing method of an electronic device according to claim 18, wherein gaps between the antenna substrate and bridging plate are sealed by thermal compression bonding of the first and second anisotropic conductive adhesive layers.

* * * * *